(12) United States Patent
Aggarwal et al.

(10) Patent No.: US 10,892,236 B2
(45) Date of Patent: Jan. 12, 2021

(54) INTEGRATED CIRCUIT HAVING A PERIPHERY OF INPUT/OUTPUT CELLS

(71) Applicant: QUALCOMM Incorporated, San Diego, CA (US)

(72) Inventors: Sumeet Aggarwal, Bangalore (IN); Kiranrao Kuduregundi, Bengaluru (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/398,610

(22) Filed: Apr. 30, 2019

(65) Prior Publication Data

US 2020/0350265 A1 Nov. 5, 2020

(51) Int. Cl.
*H01L 23/58* (2006.01)
*H01L 27/02* (2006.01)
*H01L 23/00* (2006.01)

(52) U.S. Cl.
CPC ............ *H01L 23/585* (2013.01); *H01L 24/14* (2013.01); *H01L 27/0207* (2013.01); *H01L 2224/14133* (2013.01)

(58) Field of Classification Search
CPC .... H01L 23/585; H01L 24/14; H01L 27/0207
See application file for complete search history.

(56) References Cited

U.S. PATENT DOCUMENTS

| | | | | |
|---|---|---|---|---|
| 5,535,084 A * | 7/1996 | Nakayama | .......... | H01L 27/0248 257/356 |
| 6,201,728 B1 * | 3/2001 | Narui | ...................... | G11C 7/065 365/149 |
| 6,222,213 B1 * | 4/2001 | Fujiwara | ............... | H01L 23/585 257/202 |
| 6,735,755 B2 * | 5/2004 | Shau | ................... | H01L 27/0207 257/203 |
| 6,836,026 B1 * | 12/2004 | Ali | ......................... | H01L 24/06 257/202 |
| 6,911,683 B2 * | 6/2005 | Konishi | .............. | H01L 23/5286 257/202 |
| 7,499,340 B2 * | 3/2009 | Kajigaya | ................ | G11C 5/025 257/202 |
| 8,018,038 B2 * | 9/2011 | Nishizawa | .............. | H01L 25/18 257/679 |
| 8,384,158 B2 * | 2/2013 | Su | ........................... | H01L 23/60 257/360 |
| 8,392,862 B1 * | 3/2013 | Siguenza | .............. | G06F 30/327 716/120 |
| 8,713,508 B2 * | 4/2014 | Tomoda | ................... | H01L 23/50 716/126 |
| 8,749,936 B2 * | 6/2014 | Roth | ..................... | G06F 21/755 361/93.1 |
| 9,023,717 B2 * | 5/2015 | Nakagawa | .............. | H01L 21/78 257/E21.599 |
| 9,478,529 B2 | 10/2016 | Miller et al. | | |

(Continued)

*Primary Examiner* — Ida M Soward
(74) *Attorney, Agent, or Firm* — Qualcomm Incorporated

(57) ABSTRACT

An integrated circuit, such as a flip chip, may be configured to increase the I/O cells by stacking the I/O cells in two or more rows with external high voltage circuits on opposite sides of a respective cell to reduce the distance between the rows. In addition, the integrated circuit may include a guard ring around the I/O cells to reduce signal noise interference generated by the external high voltage circuits in the I/O cells.

28 Claims, 5 Drawing Sheets

(56) References Cited

U.S. PATENT DOCUMENTS

| | | | |
|---|---|---|---|
| 9,876,006 B2* | 1/2018 | Tai | H01L 27/0277 |
| 9,972,615 B1* | 5/2018 | Wang | H01L 27/0266 |
| 10,411,095 B2* | 9/2019 | Yoshioka | H01L 29/861 |
| 2002/0158299 A1* | 10/2002 | Castro Simas | H01L 27/0207 |
| | | | 257/499 |
| 2006/0226499 A1* | 10/2006 | Shimizu | H01L 29/66568 |
| | | | 257/409 |
| 2008/0098337 A1* | 4/2008 | Perez | G06F 30/39 |
| | | | 716/122 |
| 2010/0065954 A1* | 3/2010 | Tu | H01L 24/05 |
| | | | 257/686 |
| 2010/0246079 A1* | 9/2010 | Suzuki | H01L 27/0285 |
| | | | 361/56 |
| 2011/0051299 A1* | 3/2011 | Hiraoka | H01L 27/0255 |
| | | | 361/56 |
| 2011/0260318 A1* | 10/2011 | Eisenstadt | G06F 30/392 |
| | | | 257/737 |
| 2012/0226929 A1* | 9/2012 | Lee | G06F 11/3041 |
| | | | 713/340 |

* cited by examiner

INTEGRATED CIRCUIT HAVING A PERIPHERY OF INPUT/OUTPUT CELLS

FIELD OF DISCLOSURE

This disclosure relates generally to input/output (I/O) structures, and more specifically, but not exclusively, to stacked I/O structures for integrated circuit (IC) devices.

BACKGROUND

A conventional IC device layout includes many components, one such component being the I/O structure for I/O signals. The I/O structure allows I/O signals to enter and exit the IC device as needed and is designed to accommodate a certain number of I/O signals. As the number of I/O signals increase, the structures needed to accommodate the increased signal count also increase, which translates into a requirement for more layout area (i.e., more die area). An I/O library typically includes various functional I/O cells, as well as other elements such as power cells, ground cells, spacer cells and corner cells. These cells are typically mixed as needed for the functional IC and abutted to form a continuous "pad ring" around the perimeter of the IC die. Considering the south side of an IC, the abutted I/O library cells form a horizontal I/O bank. The cells in this bank each typically contain a bond pad. In an IC with a wire-bond package, for example, these pads connect via bond wires to I/O pins in the package.

It is well known in the industry that average IC pin counts have increased steadily over the years. Consider an I/O library, with a given cell width, and an IC with a given size of the IC core circuitry that the perimeter pad-ring should enclose. With increasing pin count, a point is reached where the area inside the required pad ring exceeds the area of the core circuitry. These "pad-limited" designs are wasteful in terms of IC area. One alternative is to add a second pad ring around the die periphery. These dual I/O cell row designs are typically built with the same I/O library elements used in single row designs. In the physical design of a typical dual I/O cell row IC, the inner and outer I/O cell banks are configured independently, with a gap between the two banks. Since these dual row designs take even more of the limited layout area, their use is typically minimized to save overall layout area. This problem is especially noticeable with flip chip designs that need extra width or extra spacing for flip chip packages due to the unique bump patterns used on flip chips. Also, printed circuit board requirements may force package bumps to clump in a particular region even though the attached die is not pad limited.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an integrated circuit includes: a core region in an interior of the integrated circuit; a guard ring proximate to the core region; a first plurality of I/O cells arranged along a perimeter of the integrated circuit, each of the first plurality of I/O cells comprising an external circuit portion and a high voltage I/O circuit located proximate to the perimeter of the integrated circuit; and a second plurality of I/O cells arranged between the first plurality of I/O cells and the guard ring, each of the second plurality of I/O cells comprising an external circuit portion and a high voltage I/O circuit located proximate to the guard ring.

In another aspect, an integrated circuit includes: a core region in an interior of the integrated circuit; means for signal noise suppression proximate to the core region; first means for input and output arranged along a perimeter of the integrated circuit, the first means for input and output comprising an external circuit portion and a high voltage I/O circuit located proximate to the perimeter of the integrated circuit; and second means for input and output arranged between the first means for input and output and the means for signal noise suppression, the second means for input and output comprising an external circuit portion and a high voltage I/O circuit located proximate to the means for signal noise suppression.

In still another aspect, a flip chip includes: an integrated circuit in an interior region of the flip chip; a first plurality of I/O cells arranged along a perimeter of the flip chip, each of the first plurality of I/O cells comprising an external circuit portion and a high voltage I/O circuit located proximate to a first side of a cell; and a second plurality of I/O cells arranged between the first plurality of I/O cells and the integrated circuit, each of the second plurality of I/O cells comprising an external circuit portion and a high voltage I/O circuit located proximate to a second side of the cell opposite the first side.

In still another aspect, a flip chip includes: an integrated circuit in an interior region of the flip chip; first means for input and output arranged along a perimeter of the flip chip, each of the first means for input and output comprising an external circuit portion and a high voltage I/O circuit located proximate to a first side of the first means for input and output; and second means for input and output arranged between the first means for input and output and the integrated circuit, each of the first means for input and output comprising an external circuit portion and a high voltage I/O circuit located proximate to a second side of the second means for input and output opposite the first side.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
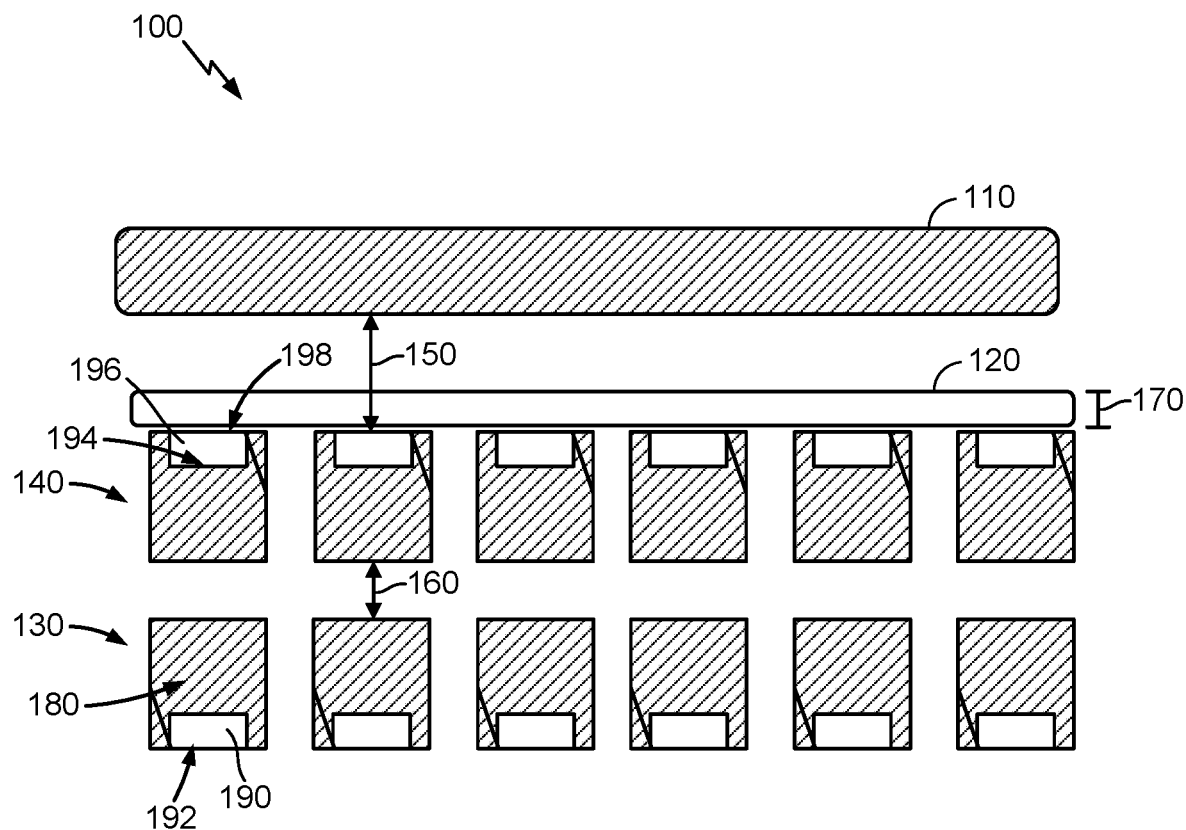
FIG. 1 illustrates an exemplary block diagram of a stacked I/O structure in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For example, an integrated circuit, such as a flip chip, may be configured to increase the I/O cells by stacking the I/O cells in two with external high voltage circuits on opposite sides of a respective cell to reduce the distance between the rows. In addition, the integrated circuit may include a guard ring around the I/O cells to reduce signal noise interference generated by the external high voltage circuits in the I/O cells. Also, the stacked I/O cells may allow three rows of I/O bumps for the integrated circuit (e.g., flip chip bumps).

FIG. 1 illustrates an exemplary block diagram of a stacked I/O structure in accordance with some examples of the disclosure. As shown in FIG. 1, an integrated circuit (IC) 100 (e.g., a flip chip) may include a core region 110, a guard ring 120, a first plurality of I/O cells 130, and a second plurality of I/O cells 140. The core region 110 may be a logic circuit or similar active circuitry, such as found on a flip chip that processes input from external sources through the I/O cells and outputs data through the I/O cells. The core region 110 may be in an interior (for example, towards a center) of the IC 100 away from the edges or perimeter. It should be understood that the interior may not be the exact center and the logic circuit or region may not be symmetrical or centered within the perimeter of the IC 100. The IC 100 may also include a channel 150 from the I/O cells to the core region 110 that allows signals to travel to and from the first plurality of I/O cells 130 and the second plurality of I/O cells 140 to the core region 110 along the channel 150. The first plurality of I/O cells 130 may be located along a perimeter of the IC 100 and spaced a distance 160 from the second plurality of I/O cells 140 of approximately 5 micrometers. The guard ring 120 may have a width 170 of approximately 8 micrometers and be spaced from the first plurality of I/O cells 130 by less than 1 micrometer and extend the entire length of the second plurality of I/O cells 140 between the second plurality of I/O cells 140 and the core region 110.

The guard ring 120 may be coupled to ground and composed of suitable material, such as copper, that allows the guard ring 120 to act as a high resistance path for noise generated in the high voltage circuit (i.e., greater than approximately 2.4 volts) of the I/O cells to avoid coupling with core circuits and reduce the signal noise (i.e., latchup) generated by the I/O cells when converting the high voltage external circuit signals to a low voltage (i.e., less than approximately 2.4 volts). In one example, the guard ring 120 may use a silicon P substrate with an N well region with N+ doping to create a high resistance path. Latchup is a parasitic effect in semiconductor technology when a PNPN parasitic structure is formed by at least two coupled bipolar transistors. When transitory voltage/current overshoot/undershoot at an input/output node occurs, the PNPN structure can be turned on and a low impedance path between VDD and VSS can be formed. This low impedance state can produce either a momentary or a permanent loss of circuit functioning.

Each of the I/O cells in the first plurality of I/O cells 130 has an external circuit 180 and a high voltage I/O circuit 190. The external circuit 180 may be coupled to an external high voltage source for input and output. The high voltage I/O circuit 190 may be located on a first side 192 of the I/O cell proximate to the perimeter of the IC 100 along with an I/O pad (not shown). Each of the I/O cells in the second plurality of I/O cells 140 has an external circuit 194 and a high voltage I/O circuit 196. The external circuit 194 may be coupled to an external high voltage source for input and output. The high voltage I/O circuit 196 may be located on a second side 198 of the I/O cell opposite the first side 192 proximate to the guard ring 120. By placing the high voltage I/O circuits 190 and 196 on opposite sides of adjoining rows of I/O cells, the distance 160 between rows may be reduced. For example, conventional I/O cells may need to be separated by approximately 120 micrometers whereas the I/O cells herein may only be separated by as little as approximately 5 micrometers with interference between the adjoining cells.

Figure 2:
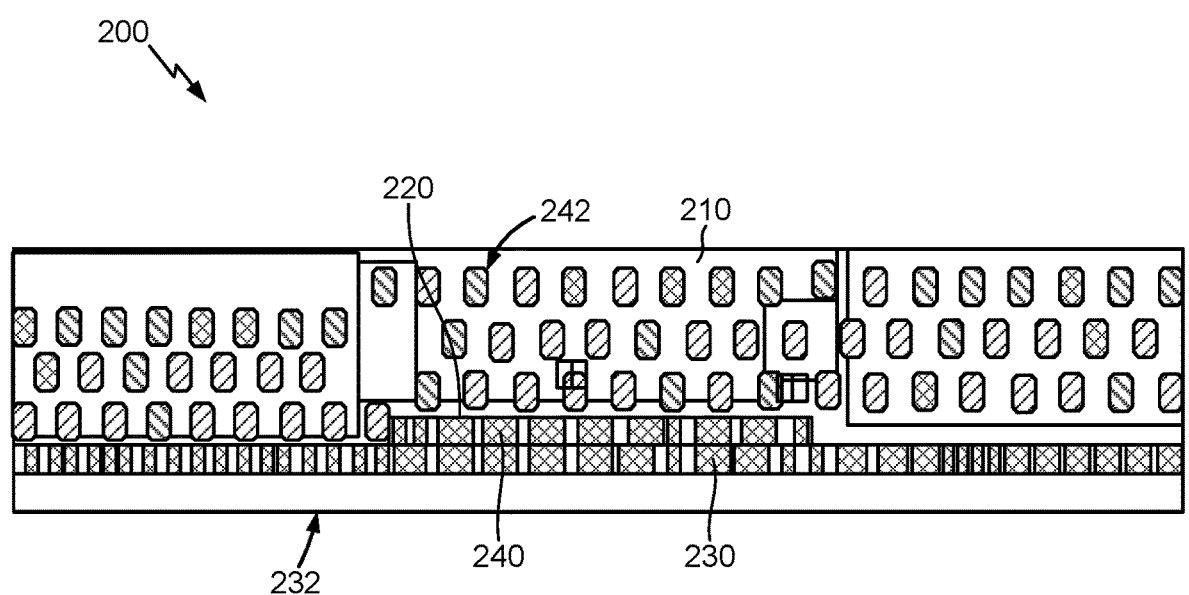
FIG. 2 illustrates an exemplary top view of a stacked I/O structure in accordance with some examples of the disclosure.

FIG. 2 illustrates an exemplary top view of a stacked I/O structure in accordance with some examples of the disclosure. As shown in FIG. 2, a flip chip 200 (e.g., IC 100) may include an integrated circuit (IC) 210 (e.g., core region 110), a guard ring 220 (e.g., guard ring 120), a first plurality of I/O cells 230 (e.g., first plurality of I/O cells 130), a second plurality of I/O cells 240 (e.g., second plurality of I/O cells 240), and a plurality of bumps 242 (e.g., solder bumps used for face down bonding of another device or component such as a printed circuit board). The plurality of bumps 242 may be arranged in three rows as shown or more, such as four rows. The use of three rows of bumps 242 may be enabled by using the stacked arrangement of the first plurality of I/O cells 230 and the second plurality of I/O cells 240. The first plurality of I/O cells 230 may be located along a perimeter 232 of the flip chip 200. The guard ring 120 may extend around the entire length of the second plurality of I/O cells 240 between the second plurality of I/O cells 240 and the IC 210. It should be understood that this is a partial view of the flip chip 200 along one side thereof and the other sides may comprise similar structures, etc.

Figure 3:
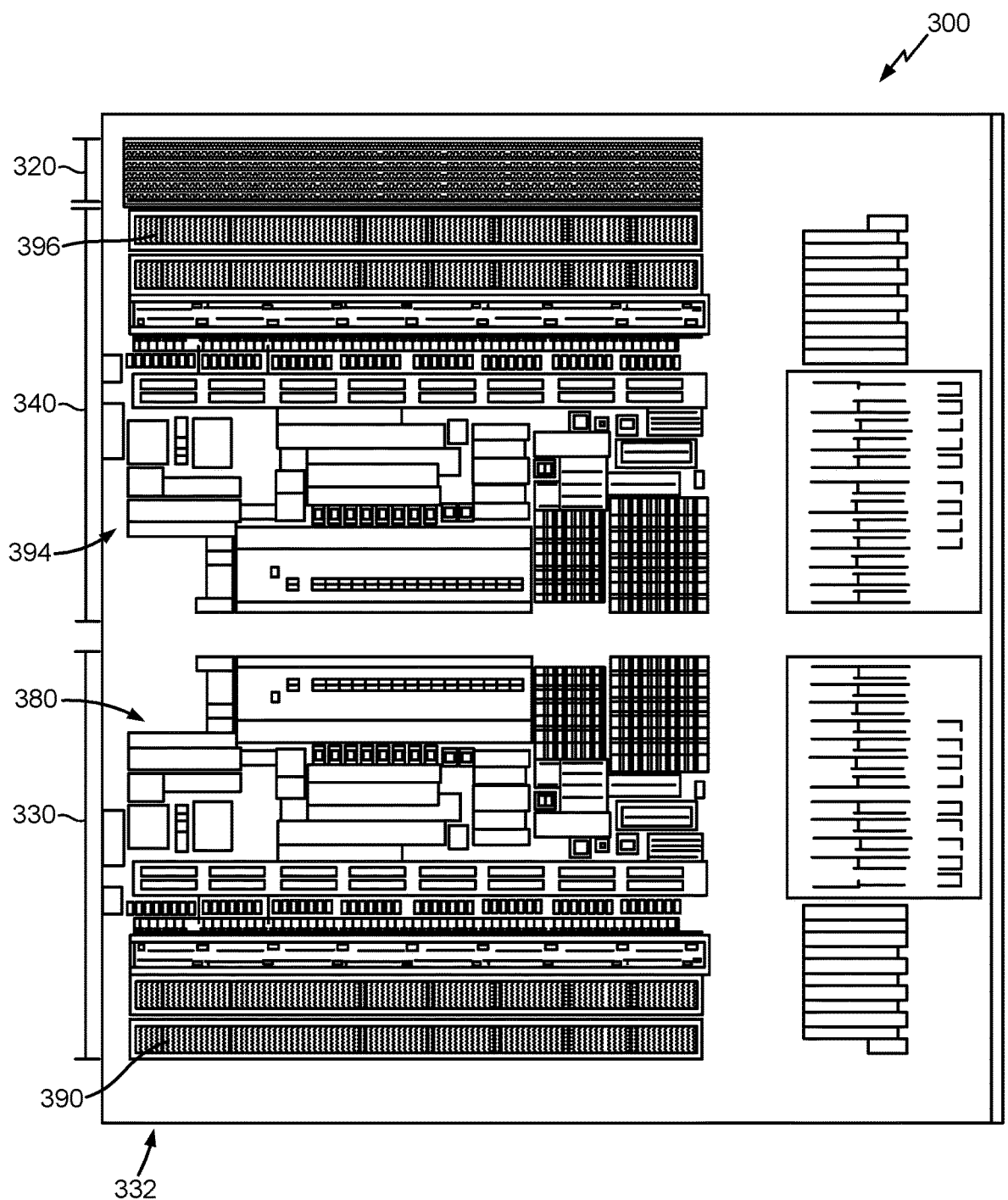
FIG. 3 illustrates another exemplary top view of a stacked I/O structure in accordance with some examples of the disclosure.

FIG. 3 illustrates another exemplary top view of a stacked I/O structure in accordance with some examples of the disclosure. As shown in FIG. 3, an IC 300 (e.g., IC 100, flip chip 200) may include a guard ring 320 (e.g., guard rings 120, 220), a first plurality of I/O cells 330 (e.g., first plurality of I/O cells 130, first plurality of I/O cells 230), and a second plurality of I/O cells 340 (e.g., second plurality of I/O cells 140, second plurality of I/O cells 240). The first plurality of I/O cells 330 may be located along a perimeter 332 of the IC 300. Each of the I/O cells in the first plurality of I/O cells 330 has an external circuit 380 (e.g., a high voltage input output circuit) and a high voltage I/O circuit 390. Each of the I/O cells in the second plurality of I/O cells 340 has an external circuit 394 (e.g., a high voltage input output circuit) and a high voltage I/O circuit 396. It should be understood that only one representative I/O cell for each plurality is shown in this partial view.

Figure 4:
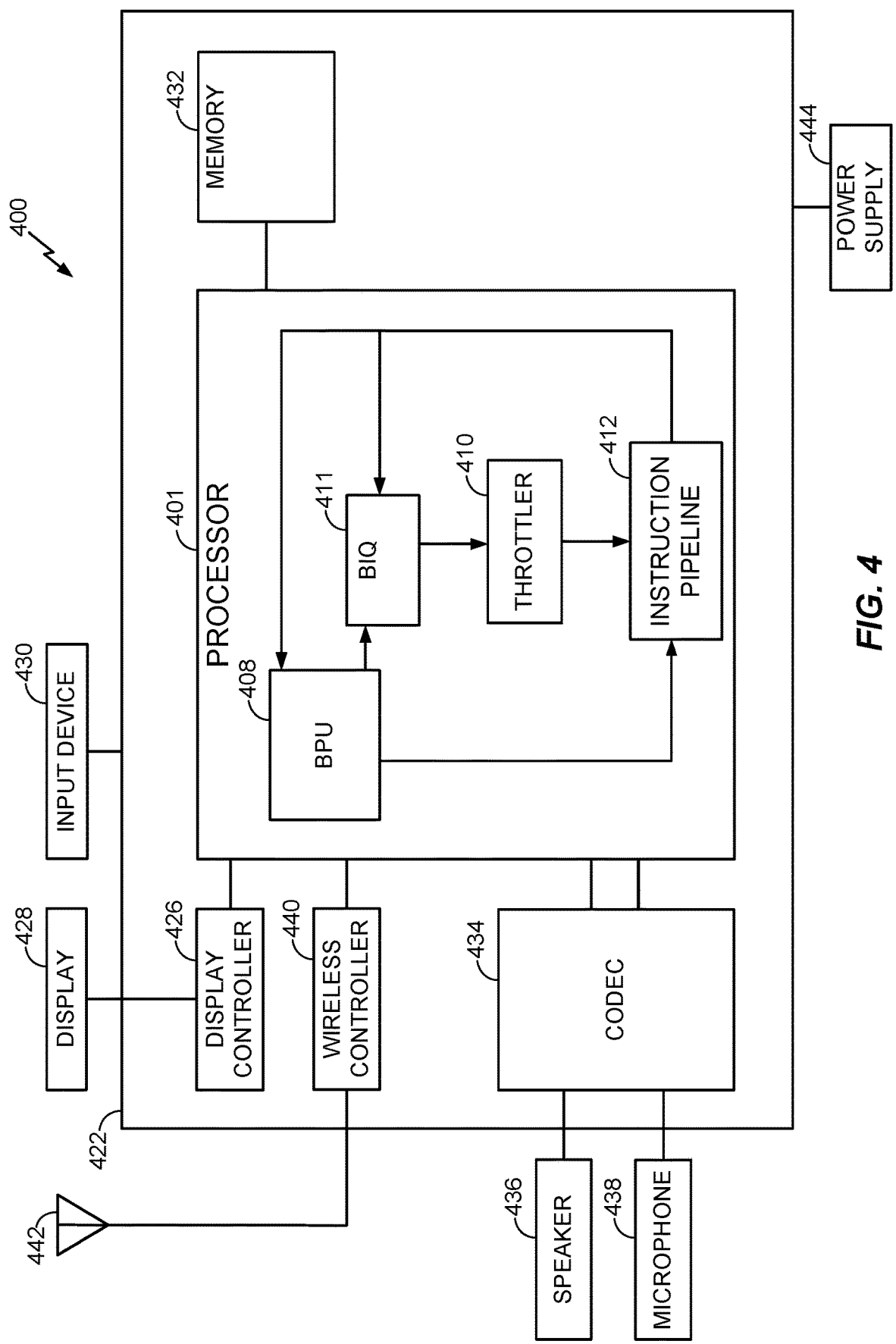
FIG. 4 illustrates an exemplary mobile device in accordance with some examples of the disclosure.

FIG. 4 illustrates an exemplary mobile device in accordance with some examples of the disclosure. Referring now to FIG. 4, a block diagram of a mobile device that is configured according to exemplary aspects is depicted and generally designated 400. In some aspects, mobile device 400 may be configured as a wireless communication device. As shown, mobile device 400 includes processor 401, which may be configured to implement the methods described herein in some aspects. Processor 401 is shown to comprise instruction pipeline 412, buffer processing unit (BPU) 408, branch instruction queue (BIQ) 411, and throttler 410 as is well known in the art. Other well-known details (e.g., counters, entries, confidence fields, weighted sum, comparator, etc.) of these blocks have been omitted from this view of processor 401 for the sake of clarity.

Processor 401 may be communicatively coupled to memory 432 over a link, which may be a die-to-die or chip-to-chip link. Mobile device 400 also include display 428 and display controller 426, with display controller 426 coupled to processor 401 and to display 428.

In some aspects, FIG. 4 may include coder/decoder (CODEC) 434 (e.g., an audio and/or voice CODEC) coupled to processor 401; speaker 436 and microphone 438 coupled to CODEC 434; and wireless controller 440 (which may include a modem) coupled to wireless antenna 442 and to processor 401.

In a particular aspect, where one or more of the above-mentioned blocks are present, processor 401, display controller 426, memory 432, CODEC 434, and wireless controller 440 can be included in a system-in-package or system-on-chip device 422. Input device 430 (e.g., physical or virtual keyboard), power supply 444 (e.g., battery), display 428, input device 430, speaker 436, microphone 438, wireless antenna 442, and power supply 444 may be external to system-on-chip device 422 and may be coupled to a component of system-on-chip device 422, such as an interface or a controller.

It should be noted that although FIG. 4 depicts a mobile device, processor 401 and memory 432 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 5:
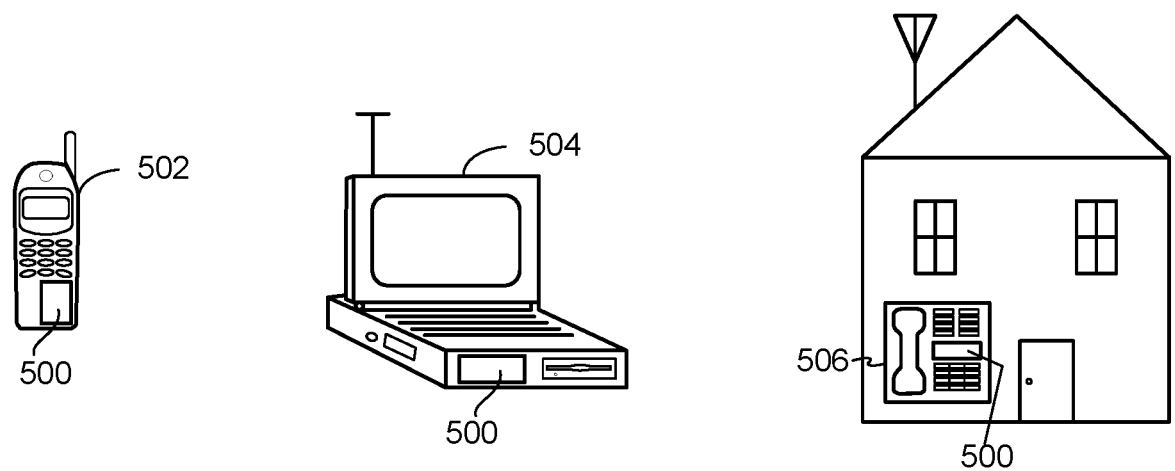
FIG. 5 illustrates various electronic devices that may be integrated with any of the aforementioned integrated device, semiconductor device, integrated circuit, die, interposer, package or package-on-package (PoP) in accordance with some examples of the disclosure.

FIG. 5 illustrates various electronic devices that may be integrated with any of the aforementioned integrated device, semiconductor device, integrated circuit, die, interposer, package or package-on-package (PoP) in accordance with some examples of the disclosure. For example, a mobile phone device 502, a laptop computer device 504, and a fixed location terminal device 506 may include an integrated device 500 as described herein. The integrated device 500 may be, for example, any of the integrated circuits, dies, integrated devices, integrated device packages, integrated circuit devices, device packages, integrated circuit packages, package-on-package devices described herein. The devices 502, 504, 506 illustrated in FIG. 5 are merely exemplary. Other electronic devices may also feature the integrated device 500 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of these aspects. For example, in one aspect, an integrated circuit (e.g., IC 100, flip chip 200, IC 300) may include a core region (e.g., core region 110, IC 210) in an interior of the integrated circuit; means for signal noise suppression (e.g., guard ring 120, guard ring 220, guard ring 320) proximate to the core region; first means for input and output (e.g., first plurality of I/O cells 130, first plurality of I/O cells 230, first plurality of I/O cells 330) arranged along a perimeter of the integrated circuit, the first means for input and output comprising an external circuit portion (e.g., external circuit 180, external circuit 380) and a high voltage I/O circuit (e.g., high voltage I/O circuit 190, high voltage I/O circuit 390) located proximate to the perimeter of the integrated circuit; and second means for input and output (e.g., second plurality of I/O cells 140, second plurality of I/O cells 240, second plurality of I/O cells 340) arranged between the first means for input and output and the means for signal noise suppression, the second means for input and output comprising an external circuit portion (e.g., external circuit 194, external circuit 394) and a high voltage I/O circuit (e.g., high voltage I/O circuit 196, high voltage I/O circuit 396) located proximate to the means for signal noise suppression. It will be appreciated that the aforementioned aspects are merely provided as examples and the various aspects claimed are not limited to the specific references and/or illustrations cited as examples.

One or more of the components, processes, features, and/or functions illustrated in FIGS. 1-5 may be rearranged and/or combined into a single component, process, feature or function or incorporated in several components, processes, or functions. Additional elements, components, processes, and/or functions may also be added without departing from the disclosure. It should also be noted that FIGS. 1-5 and its corresponding description in the present disclosure is not limited to dies and/or ICs. In some implementations, FIGS. 1-5 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated circuit, comprising:
a core region in an interior of the integrated circuit;
a guard ring proximate to the core region;
a first plurality of I/O cells arranged along a perimeter of the integrated circuit, each of the first plurality of I/O cells comprising an external circuit portion and a high voltage I/O circuit located proximate to the perimeter of the integrated circuit; and
a second plurality of I/O cells arranged between the first plurality of I/O cells and the guard ring, each of the second plurality of I/O cells comprising an external circuit portion and a high voltage I/O circuit located proximate to the guard ring.

2. The integrated circuit of claim 1, wherein the core region is configured to operate at a low voltage up to 2.4 volts and each of the external circuit portions is configured to operate at a high voltage above 2.4 volts.

3. The integrated circuit of claim 1, wherein the first plurality of I/O cells is spaced from the second plurality of I/O cells approximately 5 micrometers.

4. The integrated circuit of claim 1, wherein the guard ring is approximately 8 micrometers wide.

5. The integrated circuit of claim 4, wherein the guard ring is configured to reduce signal noise from the external circuit portions.

6. The integrated circuit of claim 1, wherein the integrated circuit is a flip-chip device.

7. The integrated circuit of claim 1, further comprising a plurality of bumps arranged in three or more rows parallel to at least one side of the perimeter, the plurality of bumps configured to couple the integrated circuit to an external interface.

8. The integrated circuit of claim 1, wherein the integrated circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

9. An integrated circuit, comprising:
a core region in an interior of the integrated circuit;
means for signal noise suppression proximate to the core region;
first means for input and output arranged along a perimeter of the integrated circuit, the first means for input and output comprising an external circuit portion and a high voltage I/O circuit located proximate to the perimeter of the integrated circuit; and
second means for input and output arranged between the first means for input and output and the means for signal noise suppression, the second means for input and output comprising an external circuit portion and a high voltage I/O circuit located proximate to the means for signal noise suppression.

10. The integrated circuit of claim 9, wherein the core region is configured to operate at a low voltage up to 2.4 volts and each of the external circuit portions is configured to operate at a high voltage above 2.4 volts.

11. The integrated circuit of claim 9, wherein the first means for input and output is spaced from the second means for input and output approximately 5 micrometers.

12. The integrated circuit of claim 9, wherein the means for signal noise suppression is approximately 8 micrometers wide.

13. The integrated circuit of claim 12, wherein the means for signal noise suppression is configured to reduce signal noise from the external circuit portions.

14. The integrated circuit of claim 9, wherein the integrated circuit is a flip-chip device.

15. The integrated circuit of claim 9, further comprising a plurality of bumps arranged in three or more rows parallel to at least one side of the perimeter, the plurality of bumps configured to couple the integrated circuit to an external interface.

16. The integrated circuit of claim 9, wherein the integrated circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

17. A flip chip, comprising:
an integrated circuit in an interior region of the flip chip;
a first plurality of I/O cells arranged along a perimeter of the flip chip, each of the first plurality of I/O cells comprising an external circuit portion and a high voltage I/O circuit located on a first side of a cell, proximate to the perimeter of the flip chip;
a second plurality of I/O cells arranged between the first plurality of I/O cells and the integrated circuit, each of the second plurality of I/O cells comprising an external circuit portion and a high voltage I/O circuit located proximate to a second side of the cell opposite the first side; and
a guard ring between the integrated circuit and the second plurality of I/O cells, the second plurality of I/O cells proximate to the guard ring.

18. The flip chip of claim 17, wherein the integrated circuit is configured to operate at a low voltage up to 2.4 volts and each of the external circuit portions is configured to operate at a high voltage above 2.4 volts.

19. The flip chip of claim 17, wherein the first plurality of I/O cells is spaced from the second plurality of I/O cells approximately 5 micrometers.

20. The flip chip of claim 17, wherein the guard ring is approximately 8 micrometers wide.

21. The flip chip of claim 17, wherein the guard ring is configured to reduce signal noise from the external circuit portions.

22. The flip chip of claim 17, further comprising a plurality of bumps arranged in three or more rows parallel to at least one side of the perimeter, the plurality of bumps configured to couple the integrated circuit to an external interface.

23. The flip chip of claim 17, wherein the flip chip is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

24. A flip chip, comprising:
an integrated circuit in an interior region of the flip chip;
first means for input and output arranged along a perimeter of the flip chip, each of the first means for input and output comprising an external circuit portion and a high voltage I/O circuit located proximate to a first side of the first means for input and output;
second means for input and output arranged between the first means for input and output and the integrated circuit, each of the first means for input and output comprising an external circuit portion and a high voltage I/O circuit located proximate to a second side of the second means for input and output opposite the first side; and
means for signal noise suppression between the integrated circuit and the second means for input and output.

25. The flip chip of claim 24, wherein the integrated circuit is configured to operate at a low voltage up to 2.4 volts and each of the external circuit portions is configured to operate at a high voltage above 2.4 volts.

26. The flip chip of claim 24, wherein the first means for input and output is spaced from the second means for input and output approximately 5 micrometers.

27. The flip chip of claim 24, wherein the means for signal noise suppression is approximately 8 micrometers wide.

28. The flip chip of claim 24, wherein the means for signal noise suppression is configured to reduce signal noise from the external circuit portions.

* * * * *